US010242138B2

(12) United States Patent
Alias et al.

(10) Patent No.: US 10,242,138 B2
(45) Date of Patent: Mar. 26, 2019

(54) METHOD OF AUTOMATIC SYNTHESIS OF CIRCUITS, DEVICE AND COMPUTER PROGRAM ASSOCIATED THEREWITH

(71) Applicant: INRIA INSTITUT NATIONAL DE RECHERCHE EN INFORMATIQUE ET EN AUTOMATIQUE, Rocquencourt (FR)

(72) Inventors: Christophe Alias, Lyons (FR); Alexandru Plesco, Lyons (FR)

(73) Assignee: Inria Institut National De Recherche En Informatique Et En Automatique, Le Chesnay (FR)

( * ) Notice: Subject to any disclaimer, the term of this patent is extended or adjusted under 35 U.S.C. 154(b) by 0 days.

(21) Appl. No.: 15/304,383

(22) PCT Filed: Apr. 10, 2015

(86) PCT No.: PCT/FR2015/050969
§ 371 (c)(1),
(2) Date: Dec. 28, 2016

(87) PCT Pub. No.: WO2015/159001
PCT Pub. Date: Oct. 22, 2015

(65) Prior Publication Data
US 2017/0132333 A1 May 11, 2017

(30) Foreign Application Priority Data

Apr. 14, 2014 (FR) .................................. 14 53308

(51) Int. Cl.
G06F 17/50 (2006.01)
(52) U.S. Cl.
CPC ........ G06F 17/505 (2013.01); G06F 17/5045 (2013.01)

(58) Field of Classification Search
CPC ............. G06F 17/5022; G06F 17/5027; G06F 17/5072; G06F 17/5068; G06F 17/5077;
(Continued)

(56) References Cited

U.S. PATENT DOCUMENTS 7,051,309 B1 * 5/2006 Crosetto ............... G06F 9/3867
712/E9.062
8,789,001 B1 * 7/2014 Sather ................. G06F 17/5054
713/100
(Continued)

FOREIGN PATENT DOCUMENTS

WO 140883 A2 12/2010
WO 159001 A1 10/2015

OTHER PUBLICATIONS

Haastregt, Sven Van, et al., "Enabling Automatic Pipeline Utilization Improvement in Polyhedral Process Network Implementations," p. 173. (2012).
(Continued)

Primary Examiner — Binh Tat
(74) Attorney, Agent, or Firm — Moritt Hock & Hamroff LLP; Bret P. Shapiro

(57) ABSTRACT

Method of automatic synthesis of circuits comprising the generation of a network of regular processes reading or writing data in channels, according to which a single producer process is authorized to write in a channel and a single consumer process is authorized to read in a channel; and a synchronization unit associated with said channel authorizes or disables the implementation of a new iteration of said producer process, respectively consumer process, as a function of a comparison of a position of execution determined as a function of the value of a new iteration collected from the producer process, respectively consumer process, and of a position of execution determined as a function of a last
(Continued)

iteration value collected from the consumer process, respectively producer process.

15 Claims, 2 Drawing Sheets

(58) Field of Classification Search
CPC .... G06F 13/16; G06F 2217/86; G06F 17/505; G06F 8/433; G06F 8/443; G06F 17/5045; G06F 2217/84; G06F 13/22; G06F 13/4291
USPC .................................................. 716/100–106
See application file for complete search history.

(56) References Cited

U.S. PATENT DOCUMENTS

| | | | | |
|---|---|---|---|---|
| 2011/0041105 A1* | 2/2011 | Chou | ...................... | G06F 13/28 716/106 |
| 2011/0307233 A1* | 12/2011 | Tseng | .................. | G06F 17/5022 703/14 |
| 2015/0128102 A1* | 5/2015 | Perry | .................. | G06F 17/5072 716/137 |

OTHER PUBLICATIONS

Beyer, Michael, et al., "Static Analysis of Run-Time Modes in Synchronous Process Network," pp. 55-57, (2012).

* cited by examiner

METHOD OF AUTOMATIC SYNTHESIS OF CIRCUITS, DEVICE AND COMPUTER PROGRAM ASSOCIATED THEREWITH

CROSS REFERENCE TO RELATED APPLICATION

This application is a U.S. National Stage filing under 35 U.S.C. § 371 of International Application Ser. No. PCT/FR2015/050969 filed on Apr. 10, 2015. International Application Ser. No. PCT/FR2015/050969 claims priority to French Application No. 1453308 filed on Apr. 14, 2014. The disclosure of these applications is hereby incorporated by reference in their entirety.

The present invention relates to a method of automatic synthesis of circuits including a step of compiling a software program in a network of regular processes interconnected with the aid of channels, according to which each channel is an addressable physical memory, each of said processes applies, in each iteration of an iteration domain with which it is associated, at least one data read in a channel and/or one data write in a channel, and a sequencing function provides, for each iteration value of each process, an execution position of the process selected in a time-sequenced set of execution positions.

Such circuit synthesis, or HLS, ("High-Level Synthesis") methods, are used for automatically generating (or compiling) a block of electronic circuits from an algorithmic description (high level language such as C, Matlab or Alpha) of the calculation to be performed by the circuit (cf. tools such as SpecC, HardwareC, HandelC, BashC, TransmogrifierC, CyberC, CatapultC). The algorithms involved are various, e.g. signal processing algorithms.

The circuit must be the most efficient possible while using the best available resources. The performances of the blocks of circuits generated are thus measured notably by the speed of processing data provided at the input, by the energy consumption, the silicon surface occupied, LUT units on FPGA, memory access, etc.

An increase in performance is obtained by splitting the processing to be carried out into tasks to be performed in parallel. Most of the time, the tasks are not totally independent, and must communicate (read/write) intermediate results between them, which notably poses the problem of synchronizing the tasks between them.

Splitting into parallel tasks and producing synchronizations requires very fine sequencing of the calculation, i.e. a reorganization of the order of execution of the algorithm operations. To be correct, a sequencing must respect the data dependencies between operations, e.g. for ensuring that data is produced before being read.

Most of the existing approaches are based on a CDFG (Control/Data Flow Graph) type representation, which express dependencies between syntactic constructions, i.e. between operation packets, which leads to a coarse over-approximation of dependencies such that a useful sequencing cannot be found.

Process networks are execution models which naturally express the parallelism of a calculation. Accordingly, they are used to represent parallel systems, and these translations of parallel systems into process networks can be used to study, analyze and measure various problems associated with parallelism (sequencing, load balancing, allocation, checkpointing, consumption, etc).

Process networks further constitute a natural intermediate representation for a device for the automatic synthesis of circuits, in which a "Front-End" block extracts the parallelism and produces a process network, and a "Back-End" block compiles the process network toward the target architecture.

While numerous advances in terms of performance have been made on the back-end aspects (construction of pipelines, placement/routing), the front-end aspects still remain rudimentary.

It is thus desirable to further increase the performance of automatically generated circuit blocks.

For this purpose, according to a first aspect, the invention provides a method of automatic synthesis of circuits of the aforementioned type characterized in that it includes the following steps, during the compiling step, for each of said channels:

a single process, termed a producer process, is authorized to write data in the channel and a single process, termed a consumer process, is authorized to read data in said channel; and a synchronization unit is associated with said channel, such that it collects, prior to the launch of each new iteration by the producer process of the channel, the value of said new iteration of the producer process, and collects, prior to the launch of each new iteration by the consumer process of the channel, the iteration value of the consumer process; said synchronization unit, following the collection of the value of a new iteration of the producer, respectively consumer process, authorizing or freezing the implementation of said new iteration of said producer, respectively consumer process, on the basis of a comparison of an execution position determined according to the new iteration value collected from the producer, respectively consumer process, and an execution position determined according to the last iteration value collected from the consumer, respectively producer process.

Such a method can be used to quickly and automatically generate circuits offering great performance in terms of speed of calculation and volume occupied by the circuit.

In embodiments, the method of automatic circuit synthesis according to the invention further comprises one or more of the following features:

said synchronization unit is such that it controls the operation of the producer process of said channel by implementing the following steps following the collection of the value of a new iteration of said producer process:
  the synchronization unit compares the new execution position of said collected value, to the execution position of the last collected iteration value of the consumer process; and
  said synchronization unit freezes the implementation by the producer process of this new iteration if the execution position of this new iteration is subsequent to the execution position of the last collected iteration value of the consumer process, the freeze being maintained by the synchronization unit until the collection of a future iteration value of the consumer process such that the execution position of this future iteration value is subsequent to said execution position of the new iteration of the consumer process;

said synchronization unit is such that it controls the operation of the consumer process of said channel by implementing the following steps following the collection of the value of a new iteration of said consumer process:
  the synchronization unit determines the execution position of that one of the iteration values of the producer process which gives rise to writing in said channel (c) the data that must be read by the consumer process during this new iteration; and said synchronization unit freezes the implementation by the consumer process of its new iteration if the determined execution position is subsequent or equal to the execution position of the last collected iteration value of the producer process, the freeze being maintained by the synchronization unit until the collection of a future iteration value of the producer process such that the execution position of this future iteration value is strictly higher than said determined execution position.

the consumer or producer process of each channel after the end of a preceding iteration of said process and prior to the launch of the new iteration succeeding the preceding iteration, delivers to the synchronization unit of the channel, the iteration value of the new iteration of the process, and implements this new iteration of the process on the basis of a control command from the supervision unit indicating a freeze or an authorization;

the consumer process of the channel after the end of a preceding iteration of said process and prior to the launch of the new iteration succeeding the preceding iteration, further delivers to the synchronization unit of the channel, said iteration value of the producer process which gives rise to writing in said channel the data that must be read by the consumer process during this new iteration.

According to a second aspect, the present invention provides a device for the automatic synthesis of circuits suitable for compiling a software program by generating a network of regular processes interconnected with the aid of channels, in which each channel is an addressable physical memory, each of said processes being suitable for applying, in each iteration of an iteration domain with which it is associated, at least one data read in a channel and/or one data write in a channel, and a sequencing function being suitable for providing, for each iteration value of each process, an execution position of the process selected in a time-sequenced set of execution positions; said circuit synthesis device being characterized in that it is suitable during said compiling, for generating and associating with each of said channels:

a single process, termed a producer process, authorized to write data in the channel and a single process, termed a consumer process, authorized to read data in said channel; and a synchronization unit associated with said channel, and suitable for collecting, prior to the launch of each new iteration by the producer process of the channel, the value of said new iteration of the producer process, and collecting, prior to the launch of each new iteration by the consumer process of the channel, the iteration value of the consumer process; said synchronization unit, following the collection of the value of a new iteration of the producer, respectively consumer process, being suitable for authorizing or freezing the implementation of said new iteration of said producer, respectively consumer process, on the basis of a comparison of an execution position determined according to the new iteration value collected from the producer, respectively consumer process, and an execution position determined according to the last iteration value collected from the consumer, respectively producer process.

According to a third aspect, the present invention provides a synthesized circuit e.g. following the implementation of a method of automatic synthesis of circuits according to the first aspect of the invention, including a network of regular processes interconnected with the aid of channels, in which each channel is an addressable physical memory, each of said processes being suitable for applying, in each iteration of an iteration domain with which it is associated, at least one data read in a channel and/or one data write in a channel, and a sequencing function being suitable for providing, for each iteration value of each process, an execution position of the process selected in a time-sequenced set of execution positions;

said method being characterized in that it includes:

a single process, termed a producer process, associated with each channel and authorized to write data in the channel and a single process, termed a consumer process, associated with each channel and authorized to read data in said channel; and a synchronization unit associated with said channel, and suitable for collecting, prior to the launch of each new iteration by the producer process of the channel, the value of said new iteration of the producer process, and collecting, prior to the launch of each new iteration by the consumer process of the channel, the iteration value of the consumer process; said synchronization unit, following the collection of the value of a new iteration of the producer, respectively consumer process, being suitable for authorizing or freezing the implementation of said new iteration of said producer, respectively consumer process, on the basis of a comparison of an execution position determined according to the new iteration value collected from the producer, respectively consumer process, and an execution position determined according to the last iteration value collected from the consumer, respectively producer process.

These features and advantages of the invention will appear on reading the following description given solely by way of example and referring to the attached drawings, in which.

Figure 1:
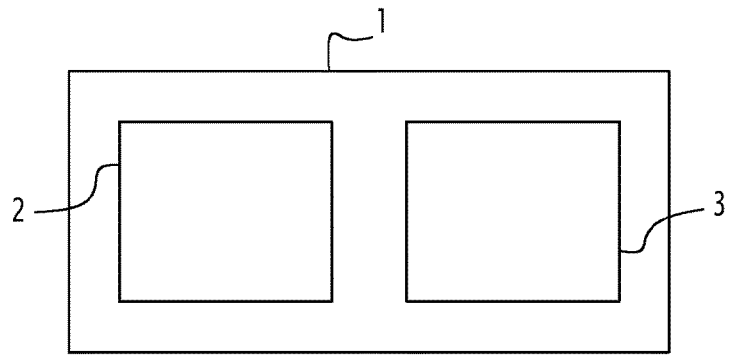
FIG. 1 represents a device for the automatic synthesis of circuits in one embodiment of the invention.

FIG. 1 is a view of a device 1 for the automatic high-level synthesis of circuits in one embodiment of the invention. This device 1 comprises a block 2, termed the "Front-End" and a block 3, termed the "Back-End".

The "Front-End" block 2 analyzes the algorithmic description of a program provided at the input of the device 1 for extracting the parallelism in it and it produces a process network as an intermediate representation of the corresponding circuit.

The "Back-End" block 3 transforms the intermediate representation of the circuit produced by the "Front-End" block 2 into a physical circuit.

The concepts and processing used in the devices for the automatic high-level synthesis of circuits, and in the "Front-End" block 2 according to the invention are first of all recalled below.

Concepts and Processing

Polyhedral Model

The polyhedral model is a tool for analyzing and optimizing static control computer programs. Static control programs only handle static tables and simple variables (not pointers) control of which is limited to "for" and "if" loops. An essential feature is that the table index functions, loop endpoints and tests for "if"s are affine functions of the surrounding "for" loop counters.

The iteration vector $\vec{i}$ of an allocation S is formed of the loop counters that surround it. The execution instance (S, $\vec{i}$) is called an operation. Operations are the basic units of polyhedral analyses. The iteration domain of an allocation is the set of all its iteration vectors in the course of execution. Under these restrictions ("for", "if" loops, affine constraints), the iteration domain of an allocation is exactly a convex polyhedron, the shape of which does not depend on the allocation inputs. It may then be calculated statically, and various polyhedral operations applied (geometric operations, linear optimization, counting, etc.) for constructing static analyses and transformations of programs.

The reads ($R_1, \ldots, R_n$) and writes (VV) in each operation W=f($R_1, \ldots, R_n$) will be distinguished below. For a static control program P, the set of elementary operations thus obtained is denoted by $\Omega(P)$. The sequential order of execution on $\Omega(P)$ is denoted by $p_{seq}$. The reads $R_i$ of an operation should be executed before writing: $R_i \prec_{seq} W$, $\forall i$. Finally, the set of memory locations accessed by each elementary operation X E $\Omega(P)$ is denoted by M(P). $\mu(X)$ denotes the location accessed (in reading or writing) by X, $\mu: \Omega(P) \rightarrow M(P)$.

For convenience, in all that follows, an operation will be referred to as an elementary operation.

Dependencies, Sequencing

There is a dependency X→Y between two operations X, Y $\in \Omega(P)$ when X is executed before Y($X \prec_{seq} Y$)) and when X and Y access the same memory location ($\mu(X)=\mu(Y)$). Depending on the nature of X and Y (read or write), the terms used are flow (W then R), anti (R then W) or exit (W then W) dependency. Anti and exit dependencies only express memory access conflicts and may be eliminated by modifying the use of the memory. In reality, only flow dependencies count, which express the calculation performed by the program. More precisely, interest is focused on flow dependencies W→R where W is the last write of $\mu(R)$ that precedes R, in other words the W that defines the value read by R. This W, which is unique, is called the source of R. It is denoted by s(R).

Thus:

$$s(R) = \max_{\prec seq}\{W \in \Omega(P), \mu(W) = \mu(R) \wedge W \prec_{seq} R\},$$

the operator $\wedge$ meaning "and".

A sequencing is an application $\theta$ which associates with each program operation an execution date, which belongs to a totally sequenced set, $\theta: \Omega(P) \rightarrow (T, \ll)$.

Most program transformations (optimizations etc.) may be written with a sequencing function. The polyhedral model provides techniques for calculating affine sequencings $\theta(S, \vec{i}) = A\vec{i} + \vec{b} \in (N^P, \ll)$, where $\ll$ designates the lexicographical order. A sequencing is correct if it respects the causality of the dependencies: i.e. if there is the dependency X→Y between two operations X, Y $\Rightarrow \theta(X) \ll \theta(Y)$, i.e. the order of execution of X is prior to that of Y. The order of execution induced by $\theta$ is denoted by $\prec_\theta$. $s_\theta$ is defined by replacing $\prec_{seq}$ mutatis mutandis by $\prec_\theta$ in the relationship relating to s(R) mentioned above.

As an example, consider the following program Prog expressed in high level language:

```
I₁ : a[0] = 0;
I₂ : a[N-1] = 0;
for ( t=0; t ≤ K-1; t++)
    {
    for (i=1; i ≤ N-2; i++)
S :     b[i] = a[i-1] + a[i] + a[i+1];
    for (i=1; i ≤ N-2; i++)
T :     a[i] = b[i];
    }
R : result = a[1];
```

This program Prog is a static control Jacobi 1D program that performs an iterative binomial relaxation calculation. The edges of table a are initialized (allocations I1 and I2), then, an average is iteratively calculated on each window of three boxes (allocations S and T). Finally, the result is retrieved (allocation R).

Figure 2:
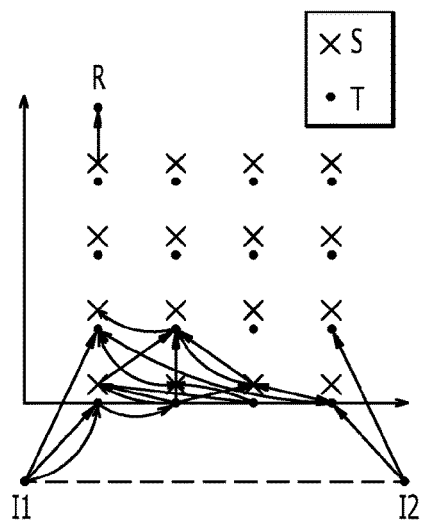
FIG. 2 illustrates the iteration and dependency domains of the program named Prog.

The iteration domains of the allocations are given and represented in FIG. 2. The domains of the allocations $I_1$, $I_2$ and R are reduced to a point. The domains of the allocations S and T are rectangles, that are superimposed here for facilitating the description. The black dots represent the iterations of S and the crosses represent the iterations of T.

This program comprises all types of dependencies, of which a few instances are represented by arrows in the drawing.

Flow dependencies: $(I_1,)\rightarrow(S, t,)$, $(I_2,)\rightarrow(S, t, N-2)$, (S, t, i)→(T, t, i), (T, t, i)→(S, t+1, i-1), (T, t, i)→(S, t+1, i), (T, t, i)→(S, t+1, i+1), (T, K-1,1)→(R,).

Anti dependencies (dashed lines): (S, t, i)→(T, t, i-1), (S, t, i)→(T, t, i), (S, t, i)→(T,t,i+1), (T, t, i)→(S,t+1,i)

Exit dependencies: (S, t, i)→(S, t+1, i) (T, T-1,1)→(R,), all of these dependencies are included in the flow dependencies, they are therefore not represented.

A valid sequencing is $\theta(I1,)=\theta(I2,)=(0)$, $\theta(S, t, i)=(1, 2t+i, t, 0)$, $\theta(T, t, i)=(1, 2t+i+1, t, 1)$, $\theta(R,)=(2)$.

The order of execution is as follows: First I1 and I2 are executed at the same time. Then, the instances of S and T are executed in an interleaved manner, as indicated in the drawing. Finally, R is executed.

This sequencing is valid in the sense that it correctly satisfies all the dependencies. For example, the first anti dependency is respected, since $\theta(S,t,i)=(1,2t+i,t,0)\ll\theta(T,t,i-1)=(1,2t+i-1+1, t, 1)=(1,2t+i, t, 1)$.

Memory Allocation, Single Assignment

A memory allocation is an application $\sigma$ that associates with each memory location m$\in$M(P) addressed by P, an alternative location $\sigma(m)$ in a new memory location set M', $\sigma: M(P) \rightarrow M'$. A sequencing $\theta$ being set, two memory locations m and m'$\in$M(P) $\theta$-interfere if $W_1$, $W_2$, $R_1$, $R_2 \in M(P)$ with $\mu(W_1)=\mu(R_1)=m$, $\mu(W_2)=\mu(R_2)=m'$, $\eta(W1)\ll\eta(R2)$, and $\theta(W2)\ll\theta(R1)$. This is then denoted by m$\bowtie_\theta$m'. A memory allocation $\sigma$ is $\theta$-correct if: m$\bowtie_\theta$m'$\Rightarrow \sigma(m)\neq\sigma(m')$ A transformed program is fully described by the data: (i) of the operations $\Omega(P)$ of program P, of a valid sequencing $\theta$, and a $\theta$-correct allocation $\sigma$: $(\Omega(P), \theta, \sigma)$. The initial program may be written $(\Omega(P), \theta_{seq}, Id)$, and hence the equivalence of calculation: $(\Omega(P), \theta_{seq}, Id)=(\Omega(P), \theta, \sigma)$, Id being the initial allocation of the data.

A program is in single assignment if each write operation writes to a different memory location, in other words if for $W_1$, $W_2$ $\epsilon\Omega(P)$, $\sigma(W_1)=\sigma(W_2)\Rightarrow W_1=W_2$. To change a program into single assignment, use is made of the source function s for reading the correct locations. M'={W, W $\in\Omega(P)$} is formed and $\sigma$ is defined by $\sigma(W)=W$ for each write W of Ω(P) and σ(R)=s(R) for each read. The transformed program (Ω(P), θ, σ) is then in single assignment.

As an example, to change the program Prog into single assignment, the process is begun by calculating the source function s(.).
s(($I_1$,)): a[0]=a[0], the source of the read a[0] of the operation (I1,) does not exist in the program, the input value of a[0] is therefore kept.
s(($I_2$,)): a[N−1]=a[N−1], for the same reasons.

For the reads of (S, T, i), the following sources are obtained:

$$s((S, t, i):a[i-1]) = \begin{cases} i = 1:(I_1) \\ i \geq 2 \wedge t = 0:a[i-1] \\ i \geq 2 \wedge t \geq 1:T[t-1][i-1] \end{cases}$$

$$s((S, t, i):a[i]) = \begin{cases} t = 0:a[i] \\ t \geq 1:T[t-1][i] \end{cases}$$

$$s((S, t, i):a[i+1]) = \begin{cases} i = N-2:(I_2) \\ i \leq N-2 \wedge t = 0:a[i+1] \\ i \leq N-2 \wedge t \geq 1:T[t-1][i+1] \end{cases}$$

On the edges (i=1 or i=N−2), the source is given by an initialization assignment ($I_1$ or $I_2$). When t=0, the source is the initial value of the table (as in the first item). Otherwise, the value is produced by an instance of T ((T, t−1, i−1), or (T, t−1, i) or (T, t−1, i+1)).

By applying the single assignment to the program Prog, the program Prog reads are obtained in single assignment where the reads are fully expanded

```
I₁ : I₁ = 0;
I₂ : I₂ = 0;
   for (t=0; t ≤ K-1; t++)
   {
      for (i=1; i ≤ N-2; i++)
S :      S[t][i] =                         <--b[i] =a[i-1] + a[i] + a[i+1];
         (i = 1 ? I₁ : (t=0 ? a[i-1] : T[t-1][i-1])) +
         (t = 0 ? a[i] : T[t-1][i]) +
         (i = N - 2 ? I₂ : (t=0 ? a[i+1] : T[t-1][i+1]));
      for (i=1; i ≤ N-2; i++)
T :      T[t][i] = S[t][i];                <--a[i] = b[i];
   }
R : R = T[K-1][1];
```

As such (before having applied the allocation (t, i)→(t %1, i %1) to S), the program only comprises flow dependencies, and may therefore be sequenced with θ(S, t, i)=(1, t+i, t, 0), θ(T), t, i)=(1, t+i, t, 1). The sequencing of $I_1$, $I_2$ and R remains unchanged.

Figure 3:
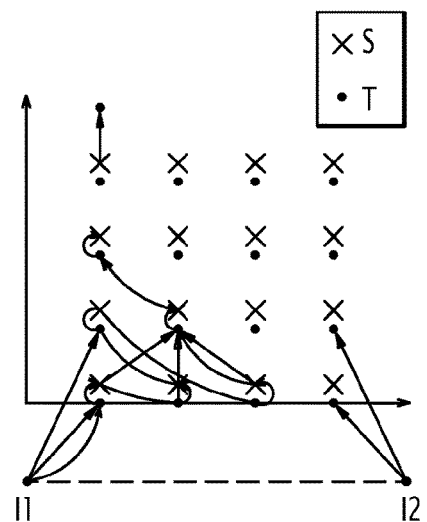
FIG. 3 illustrates the order of execution of the program Prog.

The order of execution is described in FIG. 3.

The life intervals of the boxes S[t][i] are disjoint, and therefore, the allocation σ(S[t][i])=S[t %1][i %1] may be applied to S. The transformation stage of the program Prog after memory allocation without following the order of θ is described below:

```
I₁ : I₁ = 0;
I₂ : I₂ = 0;
   for (t=0; t ≤ K-1; t++)
   {
      for (i=1; i ≤ N-2; i++)
```

```
S :    S[t%1][i] =
       (i = 1 ? I₁ : (t=0 ? a[i-1] : T[(t-1)%1][i-1])) +
       (t = 0 ? a[i] : T[t-1][i]) +
       (i = N - 2 ? I₂ : (t=0 ? a[i+1] : T[(t-1)%1][i+1]));
       for (i=1; i ≤ N-2; i++)
T :    T[t%1][i] = S[t%1][i];
   }
R : R = T[(K-1)%1][1];
```

Only one dimension of T is active. The allocation function (therefore the memory space used) depends on the sequencing selected.

Regular Process Networks

A regular process network R is the data of the following elements:

𝒫, a set of processes.

Cens={$C_1$, $C_n$}, a set of physical memories called channels; each channel $C_j$, j=1 to n, is an addressable buffer memory. The channels are split into sections, called boxes.

A set of connections of 𝒫×M×𝒫

For each channel C∈Cens, the write history 𝒲(C)= $W_1^C$, ..., $W_p^C$ and the read history ℛ(C)=$R_1^C$, ..., $R_p^C$ are invariant. This constraint implies that the execution path of each process is fixed. In particular, the processes may be described, but not solely, by static control programs.

An order of precedence between writes and reads $\prec_{prec} \subset \mathcal{W}(C) \times \mathcal{R}(R)$. $\prec_{prec}$ is extended to express the sequential order of the writes ($W_i^C \prec_{seq} W_j^C$ if i<j) and reads ($R_i^C \prec_{seq} R_j^C$ if i<j) on each channel C. In what follows, the set of operations performed by the network R is denoted by Ω(R), Ω(R)=$\cup_{C \in Cens}$ ℛ(C) ∪ 𝒲(C).

A sequencing $\theta_{obs}$ of the operations of R is observable if it describes a possible execution of the operations of R, in other words if for X, Y ∈Ω(R), $X \prec_{prec} Y \Rightarrow \theta_{obs}(X) \ll \theta_{obs}(Y)$.

The compilation of a static control program P in a regular process network is the data of the following elements:

A placement 𝒫: Ω(P)→𝒫

An allocation of channels σ: Ω(P)→$\cup_{Ci \in c} C_i$

A set of synchronizations that guarantee a total order of precedence $\prec_{synchro} \subset \Omega(P) \times \Omega(P)$ on each process Π(x)= Π(Y)⇒ X $\prec_{synchro}$ Y or Y $\prec_{prec}$ X and the respect of the flow dependencies W=s(R) W $\Rightarrow_{prec}$ R Each allocation of the program P gives rise to a process.

A network is partly equivalent to P if all the executions thereof that terminate produce the same calculation as P, i.e. if all the observable sequencings in R completely defined on Ω(R) are correct sequencings of P. In addition, if the network is guaranteed without deadlock, it is said that it is equivalent to P and that the compilation is correct.

DPN Process Networks and Compilation According to the Invention

A method and a device for the automatic synthesis of circuits according to the invention in the processing implemented by the "Front-End" block 2 uses a network of particular processes, termed a "Data-aware process network".

The "Front-End" block 2 in fact compiles a static control program that is supplied thereto as input, in DPN process networks.

A DPN is a regular process network that satisfies the following conditions:

Each channel accepts a single source process (i.e. a single process authorized to write in the channel) and a single destination process (i.e. a single process authorized to read in the channel; in one embodiment, there is even a single entry port for a single destination process).

The channels are read/write blocking memories; i.e. they are read/write random access memories such that a process can only write thereto if the content then present has not been read and conversely they cannot be read as long as the content to be read has not been written.

A compilation scheme ($\Pi$, $\sigma$, $\prec_{prec}$) of a static control program P to a DPN must satisfy the following conditions:

For each read in a channel, the source is correctly written in the same channel: if $(P_1, C, P_2)$ is a connection of $P_1$ to $P_2$ passing through the channel C, then $\Pi(R) = P2 \wedge \in C \Rightarrow \Pi(s(R)) = P_1 \wedge \sigma(s(R)) \wedge C$.

A correct sequencing $\theta$ is selected whereof the order induced on $\Omega(P)$ is total, and an allocation $\sigma$ is selected which is $\theta$-correct.

The order of precedence is total on each process, and not defined elsewhere, $\prec_{prec} = \prec_\theta \cap \{(X,Y), \Pi(X)=\Pi(Y)\}$ For each write W, the last read $d(W)=\max^{X}\prec_{prec}\{R, s(R)=W\}$ frees the box written by W, $\sigma(W)$. The box $\sigma(W)$ must then be rewritten to be able to be read. Such a compilation is correct: the DPN obtained is partly equivalent to the original program P and deadlock never occurs.

A simple DPN comprises three types of processes:

LD processes, which read the$_g$ incoming data in the central memory.

ST processes, which write the final result of the calculation in central memory.

Cal processes responsible for the calculation itself.

The case is considered of a program P to be translated in a DPN by the "Front-End" block 2 and a valid sequencing $\theta$.

In order to easily construct the LD and ST processes, the "Front-End" block 2, for each data table a read at the input in the main remote memory, adds the following family of operations to the program P:

$\vec{i} \in \Omega$: $a[\vec{i}]=0;//(LD_a, \vec{i})$, where $\Omega$ is the set of indices of table a.

For each written table b, the "Front-End" block 2 adds the following family of operations to the program, where d is any scalar variable:

$\vec{i} \in \Omega$: $d=b[\vec{i}]; //(ST_b, \vec{i})$ where $\Omega$ is the set of indices of table b.

The operations $LD_a$ should be executed at the very beginning of P, and the operations of $ST_b$ should be executed right at the end of P. Thus $(LD_a, \vec{i}_1) \prec_{prec} (S, \vec{i}_2) \prec_{prec} (ST_b, \vec{i}_3)$ for each original operation $(S, \vec{i}_2)$ of P. This property may be specified with a multidimensional sequencing.

The "Front-End" block 2 creates a DPN Network by placing each allocation on a different process, $P=\{S1, \ldots, S_n\}$ (allocations of P), and $\Pi(W)=\Pi(R1)= \ldots =\Pi(R_n)=S$, where W, R1, . . . , Rn are operations performed by the allocation S: $W=f(R1, \ldots, Rn)$. In particular, one process $L_{Da}$ is created per read table a, and one process $S_{Tb}$ per written table b. The connection of these processes to the calculation processes is naturally obtained with the source function s.

Each process is provided by the "Front-End" block 2 with the following elements:

One entry port per reference read by the allocation implemented by the process. The entry port is a multiplexer, responsible for retrieving the value of the reference in the correct channel.

An output port, which emits the value calculated by the process. The output port is a demultiplexer which writes the value calculated by the process in the right channel.

For constructing a DPN, it is sufficient for the "Front-End" block 2 to calculate these elements, and to allocate each channel (function $\sigma$).

Multiplexing, Demultiplexing

When compiling a program P, the "Front-End" block 2 calculates the source function for each read.

For an operation $(T, \vec{i})$: $\vec{i} \in D$ (iteration domain of T): $W=f(R1, \ldots, R_n)$, the source of a read R among $\{R1, \ldots, Rn\}$ is in the form:

$$s((T, \vec{i}):R) = \begin{cases} \vec{i} \in D_1:(S_1, u_1(\vec{i})) \\ \ldots \\ \vec{i} \in D_\ell:(S_\ell, u_\ell(\vec{i})) \end{cases}$$

Where the $D_k$ are closed convex polyhedra, the $u_k$ are affine functions and the $T_k$ are program allocations.

For each allocation pair (S, T) such that S writes a table read by the reference R of T, the "Front-End" block 2 creates a channel $C_{S,T,R}$. If D is the iteration domain of S, $C_{S,T,R}$ is a table of dimension equal to the dimension of D, dim D.

These channels are then connected by the "Front-End" block 2 to the processes via the entry and exit ports in the following way.

For each allocation $T \in \{T_1, \ldots, T_n\}$, for each read R of T, for each clause $\vec{i} \in D_k: (S_k, u_k(i))$ of the source $s((T,i): R)$, the "Front-End" block 2 performs the following operations:

addition to the entry port corresponding to R of a connection to channel $C_{Sk,T,R}$, and the multiplexing clause $\vec{i} \in D_k: C_{Sk,T,R}[u_k \vec{i}])$ is added which orders the reading of box $u_k(\vec{i})$ of channel $C_{Sk,T,R}$ when the current iteration satisfies $\vec{i} \in D_k$;

addition to the exit port of $S_k$ a connection to channel $C_{Sk,T,R}$, and addition of the multiplexing clause $\vec{i} \in u_k(D_k): C_{Sk,T,R}[\vec{i}]$ which orders the writing of the calculated value in box $\vec{i}$ (current iteration vector) of channel $C_{Sk,T,R}$ when the current iteration satisfies $\vec{i} \in u_k(D_k)$.

By construction, each channel $C_{Sk,T,R}$ does have a single source $(S_k)$ and a single port with a single destination (T).

A multiplexer for each entry port of an allocation T is suitable for determining the multiplexing clause corresponding to the current iteration vector of the allocation and providing the relevant channel and its box for this iteration vector and for reading this box of this channel.

A demultiplexer for each exit port of an allocation S is suitable for determining the multiplexing clause corresponding to the current iteration vector of the allocation and providing the relevant channel and its box for this iteration vector and for writing the result in this box of this channel.

Next, the LD and ST processes are connected to the DPN. Indeed, when $T_k$ is a process $LD_a$, it is an input value of the process, and the compilation by the Front-End block 2 naturally creates the multiplexing for retrieving the correct value in the channel written by $LD_a$.

In addition, the multiplexer of an output process $ST_b$ retrieves the final values in its channels for each box of b.

Figure 4:
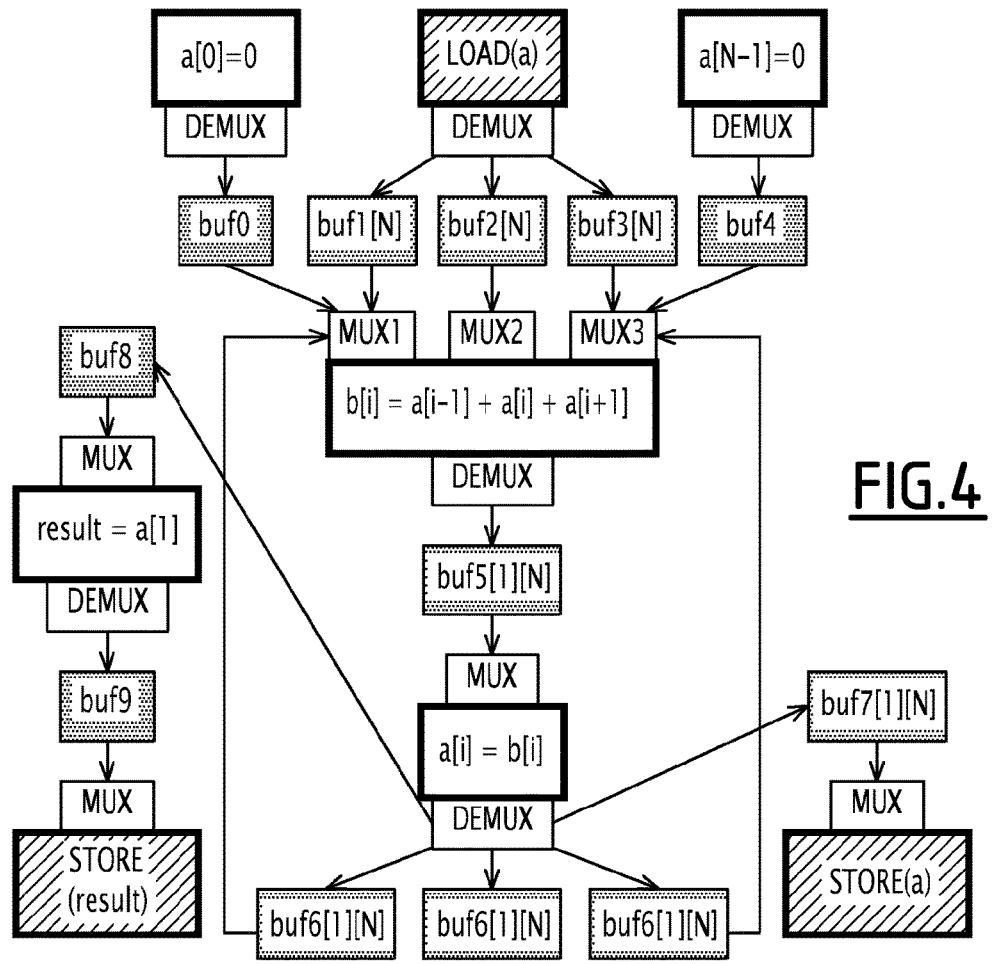
FIG. 4 is a view of processes, input multiplexers, output demultiplexers, channels implemented in the automatic generation of the circuit block executing the program Prog.

By way of illustration, FIG. 4 illustrates the result of the compilation by the "Front-End" block 2 of the program Prog. Processes are represented by boxes outlined in bold. Calculation processes are represented by boxes outlined in bold without a pattern inside, the $LD_a$ and ST processes (LOAD and STORE) are represented by boxes outlined in bold with a striated pattern inside. Channels are represented by the boxes with narrow outlines and a dotted inside pattern, multiplexers and demultiplexers are represented with narrow outlines and no inside pattern.

Each calculation process has one or more entry ports. Each entry port is arranged between a multiplexer that is specific thereto, named in FIG. 4 according to the processes "MUX", "MUX1", "MUX2", "MUX3", and the process.

The multiplexer determines which is the relevant channel and the box of the channel for the current iteration, and reads the data in this box of the relevant channel.

Similarly, each process has an exit port, which transmits the result of the current calculation to a demultiplexer, named "DEMUX" in FIG. 4. The demultiplexer determines which is the relevant channel or the relevant channels, and the box of the channel for the current iteration of the allocation and writes the result in one or more channels.

For example, the process, in the program Prog, calculating the allocation S corresponding to b[i]=a[i−1]+a[i]+a[i+1], has three entry ports, with the respective values of a[i−1], a[i], and a[i+1]. For reading a[i−1], the multiplexer MUX 1 using the source function s((S, t, i): a[i−1]) determines that when i≥2 ∧ t=0, the source is ($LD_a$, i−1), hence the selection of a channel originating from LOAD(a). The corresponding demultiplexing of the process LOAD(a) is given by [(t, i)→i−1] (i≥2∧t=0)=i≥1.

The DPN has been obtained and operates in a similar way for each source of each read of each allocation.

In what follows, the process that executes the allocation S will be referred to as "process S" and the process that executes the allocation T will be referred to as "process T".

Channel Allocation

The "Front-End" block 2 is further suitable for creating, during the compilation of the DPN network for a program P, an allocation function σ for each channel.

σ is used as an addressing function of the channel. Any request to Channel [$\vec{i}$] in reality accesses Channel [($\vec{i}$)].

The allocation is in the form of a modular affine function $A\vec{i}$ mod $\vec{b}$. The coordinates of $\vec{b}$ correspond to the sizes of the different dimensions of channel $C_{Tk,S,Rk}$, which can now be actually constructed by the Front-end block 2.

As an illustration relating to the construction of a DPN network for the program Prog, for allocating the channel C between S and T, with θ(S, t, i)=(t+i, t, 0), θ(T, t, i)=(t+i, t, 1). The front-end block 2 calculates the allocation function σ(t, i)=(t mod 1, i mod 1), e.g. as described in "Lattice-Based Array Contraction: From Theory to Practice", Christophe Alias, Fabrice Baray, Alain Darte, Research Report RR2007-44, Laboratoire de l'Informatique du Parallélisme [Parallelism Computing Laboratory], ENS-Lyon, November 2007. In other words, $C_{S,T,b[i]}$ is a 2-dimensional channel of size 1×1, which is henceforth accessed with σ.

It may be implemented with a simple register.

Channel Synchronization

In a DPN network according to the invention, the channels are read/write blocking: a box of a channel cannot be read prior to having been written (by its source), and a box cannot be written before its currently stored value is read for the last time.

The reads and writes in a channel are synchronized, according to the invention, for forcing this property.

The "Front-End" block 2 is thus suitable for constructing a synchronization unit $S_c$, for each channel c which connects the exit port of a producer process P to the entry port $R_K$ of a consumer process C.

Each iteration W (write) of the producer and each iteration R (read) of the consumer in the channel c give rise, prior to their execution, to the provision of an execution request submitted to the synchronization unit $S_c$, which decides whether or not to authorize their execution.

For forcing the flow dependencies, the synchronization unit decides in one embodiment of the invention, to stop the execution of the consumer if the data that it wishes to read has not yet been produced. And for forcing the anti-dependencies, the synchronization unit decides, in one embodiment of the invention, to stop the execution of the producer if it wishes to overwrite data that has not yet been read for the last time. It should be noted that it is not necessary to force the exit dependencies, all the writes being executed by the producer in the sequential order of the sequencing.

These two events are expressed in the following manner, e.g. through the use by the synchronization unit of the following function S, by the synchronization unit, where $X \preceq_\theta Y$ means that $\theta(X) \leq\leq \theta(Y)$ (i.e. θ(X) is prior or equal to θ(Y)) and s( ) is the source function, for determining if the response to a request from a consumer process C is a Freeze(C) signal intended for the process C or for determining if the response to a request from a producer process P is a Freeze(P) signal intended for the process P:

$$S_c(W, R) = \begin{cases} \text{Freeze}(C) & \text{if } W \preceq_\theta s(R) \\ \text{Freeze}(P) & \text{if } \{R' \in \Omega(P, I), R \prec_\theta R' \prec_\theta W \wedge \sigma_c(R') = \sigma_c(W)\} \neq \emptyset \end{cases}$$

The Freeze (C) signal interrupts the execution of the consumer process C, and Freeze (P) that of the producer process P.

In one embodiment, a Freeze signal exists as long as its condition is true. When its condition becomes false again, it ceases to be transmitted, and the process resumes its execution.

In another embodiment, a Freeze signal is transmitted, once, in response to a request from a process, when the tested condition is true. And when the condition is false or as soon as it becomes false, an authorization signal is transmitted to the process.

The first condition in the formula of $S_c$, above means that the execution of the consumer is interrupted when the data to be read has not yet been written. In other words, when the producer P executes a write W which precedes the writing of the data read by R, s(R).

The second condition means that the execution of the producer P is interrupted when it is on the point of overwriting data that has not finished being read.

In other words, when the producer P tries to write a box $\sigma_c(W)$ which still has to be read later by R'.

The source function s(R) is already calculated by the multiplexer of the process C which reads the channel c.

The Freeze (P) condition may be simplified conservatively into $R \prec_\theta W$ (in fact, if Freeze (P) is true, it follows necessarily $R \prec_\theta W$).
Proof. If Freeze (P) is true, R" exists with $R \prec_\theta R' \prec_\theta W$). The result is obtained by transitivity of $\beta_\theta$.

This theorem means that each time it is necessary to block the producer, $R \prec_\theta W$, becomes true. By contrast, $R \prec_\theta W$, may continue to be true several iterations after the box to be written has been released by the consumer unnecessarily blocking the producer. In particular, when $d(R') \prec_\theta R \prec_\theta W$, the producer must still wait for R to be executed. In the end, the producer will exactly respect the sequencing $\theta$ specified by the user, without "being over-zealous". It is therefore the responsibility of the user to provide sequencing that is as parallel as possible.

The synchronization unit $S_c$ respects the data dependencies and never produces any deadlock.

Figure 5:
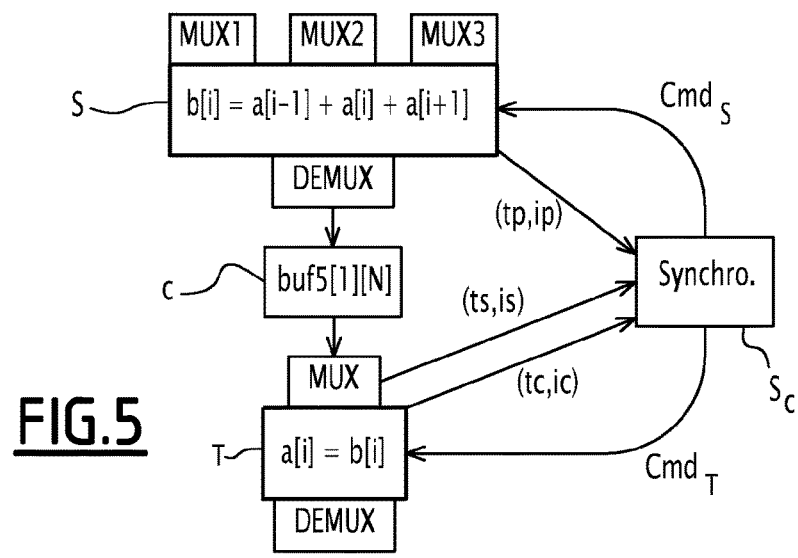
FIG. 5 is a view representing two processes of the program Prog, of the channel between these two processes and the synchronization unit associated with the channel.

As an illustration, with reference to FIG. 5, consider again the channel $c=C_{S,T,b[t]}$ between the S (producer) and T (consumer) processes.

The consumer process T, before initiating each new iteration $(t_C, i_C)$, transmits to the synchronization unit of the channel c in which its multiplexer has determined that it has to read a reference, a request for authorizing execution of a new iteration, the identifier of its new iteration, $(t_C, i_C)$, and the identifier of the expected corresponding iteration $(t_S, i_S)$ of the producer processor S, i.e. which gives rise to writing this reference in the channel c. $(t_S, i_S)$ is obtained by the source function s, hence the index 's'. The consumer process does not initiate this new iteration until it has been authorized by the synchronization unit.

Similarly, the producer process S, before initiating each new iteration $(t_P, i_P)$, transmits to the synchronization unit of the channel c in which its demultiplexer has determined that it has to write a result, a request for authorizing the execution of a new iteration and the identifier of its new iteration, $(t_P, i_P)$. The producer process does not initiate this new iteration until it has been authorized by the synchronization unit.

Suppose that the synchronization unit has just received the request for authorizing the execution of a new iteration of the consumer process T, $(t_C, i_C)$, the identifier of its new iteration, $(t_C, i_C)$, and the identifier of the expected corresponding iteration $(t_S, i_S)$ of the producer processor S.

If $\theta(S, t_S, i_S) << \theta(S, t_P, i_P)$, $((t_P, i_P)$ being the last iteration identifier of the producer process S then transmitted by S to the synchronization unit) and $\theta$ the sequencing function, the synchronization unit authorizes the new iteration $(t_C, i_C)$ of the consumer T. A corresponding command $Smd_T$ is then transmitted in response by the synchronization unit to the consumer process T (as seen previously, this command is then an authorization signal or the absence of a Freeze(C) signal according to the embodiments mentioned).

If on the contrary $\theta(S, t_P, i_P) \leq\leq \theta(S, t_S, i_S)$, and while this last expression remains true $((t_P, i_P)$ being the last iteration identifier of the producer process S then transmitted by S to the synchronization unit), the synchronization unit does not authorize the new iteration $(t_C, i_C)$ of the consumer T. A corresponding command $Smd_T$ is then transmitted in response by the synchronization unit to the consumer process T (as seen previously, this command is then a continuous or one-off Freeze(C) signal according to the embodiments mentioned).

Now suppose that the synchronization unit has just received the request for authorizing the execution of a new iteration of the producer process S and the identifier of its new iteration, $(t_P, i_P)$.

If $\theta(S, t_P, i_P) \leq\leq \theta(T, t_C, i_C)$, $((t_C, i_C)$ being the last iteration identifier of the consumer process T then transmitted by T to the synchronization unit), the synchronization unit authorizes the new iteration $(t_P, i_P)$ of the producer S. A corresponding command $Smd_S$ is then transmitted in response by the synchronization unit to the producer process S (as seen previously, this command is then an authorization signal or the absence of a Freeze(P) signal according to the embodiments mentioned).

If on the contrary $\theta(T, t_C, i_C) << \theta(S, t_P, i_P)$, and while this last expression remains true, the synchronization unit does not authorize the new iteration $(t_P, i_P)$ of the producer process S. A corresponding command $Smd_S$ is then transmitted in response by the synchronization unit to the consumer process T (as seen previously, this command is then a continuous or one-off Freeze(P) signal according to the embodiments mentioned).

By taking as the sequencing function that described in the preceding examples relating to the construction of a DPN network for the program Prog, S being the producer process and T being the consumer process, the expressions relating to Freeze(C) and Freeze(P) described above become:

Freeze(C) if, and while, $(t_P+i_P, t_P, 0) \leq\leq (t_S+i_S, t_S, 0)$ i.e. if and while: $(t_P+i_P < t_S+i_S) \lor (t_P+i_P=t_S+i_S \prec t_P < t_S) \lor (t_P+i_P=t_S+i_S \prec t_P=t_S)$;

$\lor$ meaning "OR".

Freeze(P) if, and while, $(t_C+i_C, t_C, 1) << (t_P+i_P, t_P, 0)$ i.e. if and while: $(t_C+i_S < tp+i_P) \lor (t_C+i_S=t_P+i_P \prec t_C < t_P)$.

By definition, the lexicographical order (<<) produces very redundant expressions, which enables a very simple test circuit to be produced.

It will be noted that in other embodiments, other synchronization rules are implemented by the synchronization unit for synchronizing between the producer and consumer processes associated with the same channel.

Once the transformation into an intermediate DPN representation has thus been performed by the "Front-End" block 2 from the algorithmic representation of the program Prog, this intermediate representation is provided to the "Back-End" block 3.

In a known manner, the "Back-End" block 3 materially constructs the block of electronic circuits from this intermediate DPN representation. An existing synthesis tool, for example, may be used such as C2H, as described in "Christophe Alias, Alain Darte, and Alexandru Plesco. Optimizing DDR-SDRAM Communications at C-Level for Automatically-Generated Hardware Accelerators. An Experience with the Altera C2H HLS Tool. In 21st IEEE International Conference on Application-specific Systems, Architectures and Processors (ASAP'10), Rennes, France, pages 329-332, July 2010, IEEE Computer Society". Each process, channel, multiplexer is described as a C2H function. Each function is translated by C2H in a hardware module. The connections between the modules are specified to C2H using connection pragmas. Each connection will be translated by C2H in a standard hardware bus.

A device for the automatic synthesis of circuits according to the invention can be used to automatically generate electronic circuits performing the calculations of a program P written in a high-level language, quickly and requiring a limited occupied physical volume.

There are many parallel execution models in the form of process networks (KPN, SDF, etc.). The invention provides for the compilation in DPN (Data-aware Process Network) process networks according to a parallel execution model suited to the hardware constraints of circuit synthesis in which data transfers with a remote memory are explicit. Such a compilation in DPN is consistent in that it transforms a sequential program into an equivalent DPN process network, guaranteed without deadlock. The inputs/outputs (i.e. the data transfers with a remote memory) are explicit and the communication channels are buffer memories much less constraining than FIFOs, controlled by synchronization units of equivalent performance.

The invention claimed is:

1. A method to synthesize a circuit, the method comprising:
   compiling a software program, into a network of regular processes interconnected with the aid of channels and each channel includes an addressable physical memory, and each channel is associated with a unique producer process and a unique consumer process;
   collecting, by a synchronization unit associated with a channel, a value of a producer iteration of the producer process of the channel, wherein the producer process writes data in the channel upon an authorization from the synchronization unit;
   determining, by the synchronization unit, a producer execution position based on the producer iteration value collected from the producer process;
   collecting, by the synchronization unit, a value of a consumer iteration of the consumer process of the channel, wherein the consumer process reads at least part of the data in the channel upon an authorization from the synchronization unit;
   determining, by the synchronization unit, a consumer execution position based on the consumer iteration value collected from the consumer process;
   comparing, by the synchronization unit, the producer execution position with the consumer execution position;
   authorizing or freezing an implementation of the producer iteration of the producer process based on the comparison;
   authorizing or freezing an implementation of the consumer iteration of the consumer process based on the comparison;
   synthesizing the circuit based on the authorizing and freezing of the implementation of the producer iteration and the authorizing and freezing of the implementation of the consumer iteration; and
   fabricating a field-programmable gate array or chip based on the synthesis of the circuit.

2. The method to synthesize a circuit as claimed in claim 1 wherein the synchronization unit controls the operation of the producer process of said channel, the method further comprising, following the collection of the value of the producer iteration of said producer process:
   comparing, by the synchronization unit, the producer execution position to the execution position of a previous collected consumer iteration value of the consumer process; and
   freezing the implementation by the producer process of the producer iteration when the producer execution position of the producer iteration is subsequent to the consumer execution position of the previous collected consumer iteration value of the consumer process, wherein the freeze is maintained by the synchronization unit until the synchronization unit collects a future consumer iteration value of the consumer process such that the execution consumer position of the future consumer iteration value is subsequent to the producer execution position of the future producer iteration of the consumer process.

3. The method to synthesize a circuit as claimed in claim 1, wherein the synchronization unit controls the operation of the producer process of said channel, the method further comprising, following the collection of the value of the producer iteration of said producer process:
   determining, by the synchronization unit, a target producer execution position of the producer iteration value of the producer process which causes the producer process to write the data in the channel wherein at least part of the data is required to be read by the consumer process during the consumer iteration; and
   freezing, by the synchronization unit, the consumer process of the consumer iteration if the determined producer execution position is subsequent or equal to the target producer execution position of the last collected producer iteration value of the producer process, wherein the freeze is maintained by the synchronization unit until the synchronization unit collects a future producer iteration value of the producer process such that the producer execution position of the future producer iteration value is higher than the target producer-execution position.

4. The method to synthesize a circuit as claimed in claim 1, wherein the consumer or producer process of each channel, after the end of a preceding iteration of the consumer or producer process and prior to the launch of a new iteration succeeding the preceding iteration, delivers to the synchronization unit of the channel, the iteration value of the new iteration of the process, and the synchronization unit controls the consumer or producer process based on a control command from a supervision unit indicating a freeze or an authorization.

5. The method to synthesize a circuit as claimed in claim 4, wherein the consumer process of the channel, after the end of a preceding iteration of said process and prior to the launch of a new iteration succeeding the preceding iteration, further delivers to the synchronization unit of the channel, said producer iteration value of the producer process which gives rise to writing in the channel the data that is read by the consumer process during the new iteration.

6. A device to synthesize a circuit, the device comprising:
   a producer, wherein the producer is authorized to execute a unique producer process, to write data in a channel of a network of regular processes interconnected with the aid of channels wherein each channel includes an addressable physical memory;
   a consumer, wherein the consumer is authorized to execute a unique consumer process, to read data in the channel; and
   a synchronization unit associated with the channel to collect, prior to the launch of each new iteration by the producer process of the channel, a value of the new iteration of the producer process, and to collect, prior to the launch of each new iteration by the consumer process of the channel, an iteration value of the consumer process; the synchronization unit, following the collection of the value of the new iteration of the producer and consumer process respectively, determines to authorize or freeze the implementation of the new iteration of the producer and consumer process respectively, based on a comparison of a producer execution position determined according to the new iteration value collected from the producer, and a consumer execution position determined according to the iteration value collected from the consumer process, wherein the circuit is synthesized based on the authorizing and freezing of the implementation of the producer iteration and the authorizing and freezing of the implementation of the consumer iteration and a field-programmable gate array or chip is fabricated based on the synthesis of the circuit.

7. The device to synthesize a circuit as claimed in claim 6, wherein the synchronization unit controls the operation of the producer process following the collection of the value of a new iteration of the producer process by a comparison of the consumer execution position of the collected value to the execution position of a previous collected consumer iteration value of the consumer process and freezes the producer process of the producer iteration when the producer execution position of the producer iteration is subsequent to the consumer execution position of the previous collected iteration value of the consumer process, wherein the synchronization unit maintains the freeze until the collection of a future consumer iteration value of the consumer process such that the producer execution position of this future producer iteration value is subsequent to the consumer execution position of the consumer iteration of the consumer process.

8. The device to synthesize a circuit as claimed in claim 6, wherein the synchronization unit controls the operation of the consumer process following the collection of the value of a new iteration of the consumer process by a determination that the producer execution position of the producer iteration value of the producer process causes the producer process to write data in the channel and the data is read by the consumer process during the consumer iteration wherein the synchronization unit freezes the consumer process of the consumer iteration if the determined consumer execution position is subsequent or equal to the producer execution position of a previous collected producer iteration value of the producer process and maintains the freeze until the collection of a future producer iteration value of the producer process such that the producer execution position of this future iteration value is higher than the determined consumer execution position.

9. The device to synthesize a circuit as claimed in claim 6, wherein the consumer or producer process of each channel, after the end of a preceding iteration of the consumer or producer process and prior to the launch of a new iteration succeeding the preceding iteration, delivers to the synchronization unit of the channel the iteration value of the new iteration of the process, and implements this new iteration of the process based on a control command from a supervision unit indicating a freeze or an authorization.

10. The device to synthesize a circuit as claimed in claim 9, wherein the consumer process of the channel, after the end of a preceding iteration of the process and prior to the launch of a new iteration succeeding the preceding iteration, delivers to the synchronization unit of the channel, the producer iteration value of the producer process which causes the producer process to write the data in the channel that is read by the consumer process during the new iteration.

11. A synthesized circuit for fabricating a field-programmable gate array or chip, the synthesized circuit comprising:
a network of regular processes interconnected with the aid of channels, wherein each channel includes an addressable physical memory, each of said processes in each iteration of an iteration domain with which it is associated performs at least one data read in a channel and/or one data write in a channel, and a sequencing function for each iteration value of each process, determines an execution position of the process selected in a time-sequenced set of execution positions;
a producer associated with each channel and authorized to execute a unique producer process to write data in the channel;
a consumer associated with each channel and authorized to execute a unique consumer process to read data in said channel; and
a synchronization unit associated with each channel to collect, prior to the launch of each new iteration by the producer process of the channel, a value of a new iteration of the producer process, and to collect, prior to the launch of each new iteration by the consumer process of the channel, an iteration value of the consumer process, the synchronization unit, following the collection of the value of a new iteration of the producer and consumer process respectively determines to authorize or freeze the new iteration of said producer and consumer process respectively, on the basis of a comparison of a producer execution position determined according to the new iteration value collected from a producer, and a consumer execution position determined according to the last iteration value collected from the consumer;
wherein a field-programmable gate array or chip is fabricated from the synthesized circuit.

12. The synthesized circuit as claimed in claim 11, wherein the synchronization unit controls the operation of the producer process of the channel by a collection of a value of a new iteration of the producer process and compares the consumer execution position of the collected value to the execution position of a previous collected consumer iteration value of the consumer process and determines to freeze the producer process of the producer iteration when the producer execution position of the producer iteration is subsequent to the consumer execution position of a previous collected iteration value of the consumer process, wherein the synchronization unit maintains the freeze until the collection of a future consumer iteration value of the consumer process such that the producer execution position of this future consumer iteration value is subsequent to the consumer execution position of the consumer iteration of the consumer process.

13. The synthesized circuit as claimed in claim 11, wherein the synchronization unit controls the operation of the consumer process of the channel by collection of the value of a new iteration of the consumer process and determines the producer execution position of the producer iteration value of the producer process causes the producer process to write data in the channel and the data is read by the consumer process during the consumer iteration wherein the synchronization unit freezes the consumer process of the consumer iteration if the determined consumer execution position is subsequent or equal to the producer execution position of a previous collected producer iteration value of the producer process and maintains the freeze until the collection of a future producer iteration value of the producer process such that the producer execution position of this future iteration value is higher than the determined consumer execution position.

14. The synthesized circuit as claimed in claim 11, wherein the consumer or producer process of each channel, after the end of a preceding iteration of the consumer or producer process and prior to the launch of a new iteration succeeding the preceding iteration, delivers to the synchronization unit of the channel the iteration value of the new iteration of the process, and implements this new iteration of the process based on a control command from a supervision unit indicating a freeze or an authorization.

15. The synthesized circuit as claimed in claim 14, wherein consumer process of the channel, after the end of a preceding iteration of the process and prior to the launch of a new iteration succeeding the preceding iteration, delivers to the synchronization unit of the channel, the producer iteration value of the producer process which causes the producer process to write the data in the channel that is read by the consumer process during the new iteration.

* * * * *